(12) United States Patent
Kong et al.

(10) Patent No.: US 10,606,131 B2
(45) Date of Patent: Mar. 31, 2020

(54) DISPLAY DEVICE AND METHOD OF MANUFACTURING THE SAME

(71) Applicant: LG Display Co., Ltd., Seoul (KR)

(72) Inventors: Young-Hyun Kong, Paju-si (KR); Gyu-Bum Jang, Paju-si (KR); Mi-Sun Park, Paju-si (KR); Hye-Rim Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/185,302

(22) Filed: Nov. 9, 2018

(65) Prior Publication Data

US 2019/0137806 A1    May 9, 2019

(30) Foreign Application Priority Data

Nov. 9, 2017 (KR) .......................... 10-2017-0148615

(51) Int. Cl.
| | | |
|---|---|---|
| *G02F 1/1339* | (2006.01) | |
| *G02F 1/1341* | (2006.01) | |
| *H01L 27/12* | (2006.01) | |
| *H01L 29/786* | (2006.01) | |
| *G02F 1/1333* | (2006.01) | |

(52) U.S. Cl.
CPC ........ *G02F 1/13394* (2013.01); *G02F 1/1339* (2013.01); *G02F 1/1341* (2013.01); *H01L 27/1218* (2013.01); *H01L 27/1244* (2013.01); *H01L 27/1248* (2013.01); *H01L 27/1262* (2013.01); *H01L 29/78669* (2013.01); *G02F 1/133345* (2013.01)

(58) Field of Classification Search
CPC .............. G02F 1/1339; G02F 1/13452; G02F 1/13458; G02F 1/133345; G02F 1/13394
See application file for complete search history.

(56) References Cited

U.S. PATENT DOCUMENTS

| | | |
|---|---|---|
| 2006/0001789 A1 | 1/2006 | Ahn |
| 2006/0023135 A1 | 2/2006 | Park |
| 2009/0237581 A1 | 9/2009 | Kim et al. |
| 2014/0016070 A1 | 1/2014 | Choi et al. |

(Continued)

FOREIGN PATENT DOCUMENTS

| | | |
|---|---|---|
| KR | 10-2006-0000961 A | 1/2006 |
| KR | 10-2006-0043040 A | 5/2006 |

(Continued)

OTHER PUBLICATIONS

Office Action dated Feb. 21, 2019, from the Korean Intellectual Property Office in counterpart Application No. 10-2017-0148615.

*Primary Examiner* — Jessica M Merlin

(74) *Attorney, Agent, or Firm* — Morgan, Lewis & Bockius LLP

(57) ABSTRACT

Provided are a display device and a method of manufacturing the same. A display device includes: a first substrate and a second substrate spaced apart from and facing each other, a seal pattern on the first substrate at an edge between the first and second substrates, a gate insulating pattern including an inorganic insulating material, the gate insulating pattern directly contacting the seal pattern on the first substrate, and a protective film including an organic insulating material and including an etched groove through which the gate insulating pattern is exposed.

16 Claims, 11 Drawing Sheets

(56) References Cited

U.S. PATENT DOCUMENTS

| 2015/0194625 | A1* | 7/2015 | Kim | .................... | H01L 27/3223 |
| | | | | | 257/40 |
| 2018/0203318 | A1* | 7/2018 | Abe | .................. | G02F 1/136286 |
| 2019/0204655 | A1* | 7/2019 | Shimizu | ................ | G02F 1/1345 |

FOREIGN PATENT DOCUMENTS

| KR | 10-2009-0100056 A | 9/2009 |
| KR | 10-2014-0010634 A | 1/2014 |
| KR | 10-2015-0081813 A | 7/2015 |

* cited by examiner

DISPLAY DEVICE AND METHOD OF MANUFACTURING THE SAME

CROSS-REFERENCE TO RELATED APPLICATION(S)

This application claims the benefit of and priority to Korean Patent Application No. 10-2017-0148615, filed on Nov. 9, 2017, the entirety of which is hereby incorporated by reference.

BACKGROUND

1. Technical Field

The present disclosure relates to a display device and, more particularly, to a display device including a seal pattern, and a method of manufacturing the same.

2. Discussion of the Related Art

Recently, as society has entered a full-fledged information age, a display field has rapidly developed for processing and displaying mass information. In response to this, various display devices have been developed and brought into the spotlight.

Some examples of the display device include liquid-crystal display devices (LCDs), plasma display panel devices (PDPs), field-emission display devices (FEDs), electroluminescent display devices (ELDs), organic light-emitting diode devices (OLEDs), and the like. These display devices exhibit high performance in terms of thinness, being light weight, and having low power consumption, and are rapidly replacing existing cathode ray tube displays (CRTs).

Among such display devices, an LCD includes an array substrate including a thin film transistor, a color filter substrate including a color filter and/or a black matrix, and a liquid crystal layer between the array substrate and the color filter substrate, so that a display panel is formed. An alignment state of the liquid crystal layer is adjusted according to an electric field applied between two electrodes of a pixel region, and accordingly, the transmittance of light is adjusted. Thus, an image may be displayed.

Further, an OLED includes a first substrate including switching and driving thin film transistors, first and second electrodes, and an organic light-emitting layer interposed between the first and second electrodes, and a second substrate bonded to an upper portion of the first substrate, so that a display panel is formed. A degree of light emission of an organic material is adjusted according to a level of a voltage or an amount of a current applied between two electrodes of a pixel region. Thus, an image may be displayed.

Meanwhile, such a display device includes a seal pattern for maintaining a cell gap between the first substrate and the second substrate along an edge between the first substrate and the second substrate. Recently, studies are being actively conducted to reduce a line width of a seal pattern, while maintaining a constant cell gap and securing an adhesive force to implement a narrow bezel. Particularly, studies are also being conducted to minimize defects occurring in a line due to oxidation, or the like, of a line positioned under a seal pattern in a process of reducing a line width of the seal pattern.

SUMMARY

Accordingly, the present disclosure is directed to a display device and a method of manufacturing the same that substantially obviate one or more of the issues due to limitations and disadvantages of the related art.

An aspect of the present disclosure is to provide a display device in which defects occurring in a line positioned to correspond to a region in which a seal pattern will be formed is reduced or minimized, while reducing a line width of the seal pattern, maintaining a cell gap, and improving an adhesive force.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided a display device, including: a first substrate and a second substrate spaced apart from and facing each other, a seal pattern on the first substrate at an edge between the first and second substrates, a gate insulating pattern including an inorganic insulating material, the gate insulating pattern contacting the seal pattern on the first substrate, and a protective film including an organic insulating material and including an etched groove through which the gate insulating pattern is exposed.

In another aspect, there is provided a method of manufacturing a display device, the method including: providing a first substrate and a second substrate spaced apart from and facing each other, providing a seal pattern on the first substrate at an edge between the first and second substrates, providing a gate insulating pattern including an inorganic insulating material, the gate insulating pattern contacting the seal pattern on the first substrate, and providing a protective film including an organic insulating material and including an etched groove through which the gate insulating pattern is exposed.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, that may be included to provide a further understanding of the disclosure and are incorporated in and constitute a part of this specification, illustrate embodiments of the disclosure and together with the description serve to explain various principles of the disclosure.

Figure 1:
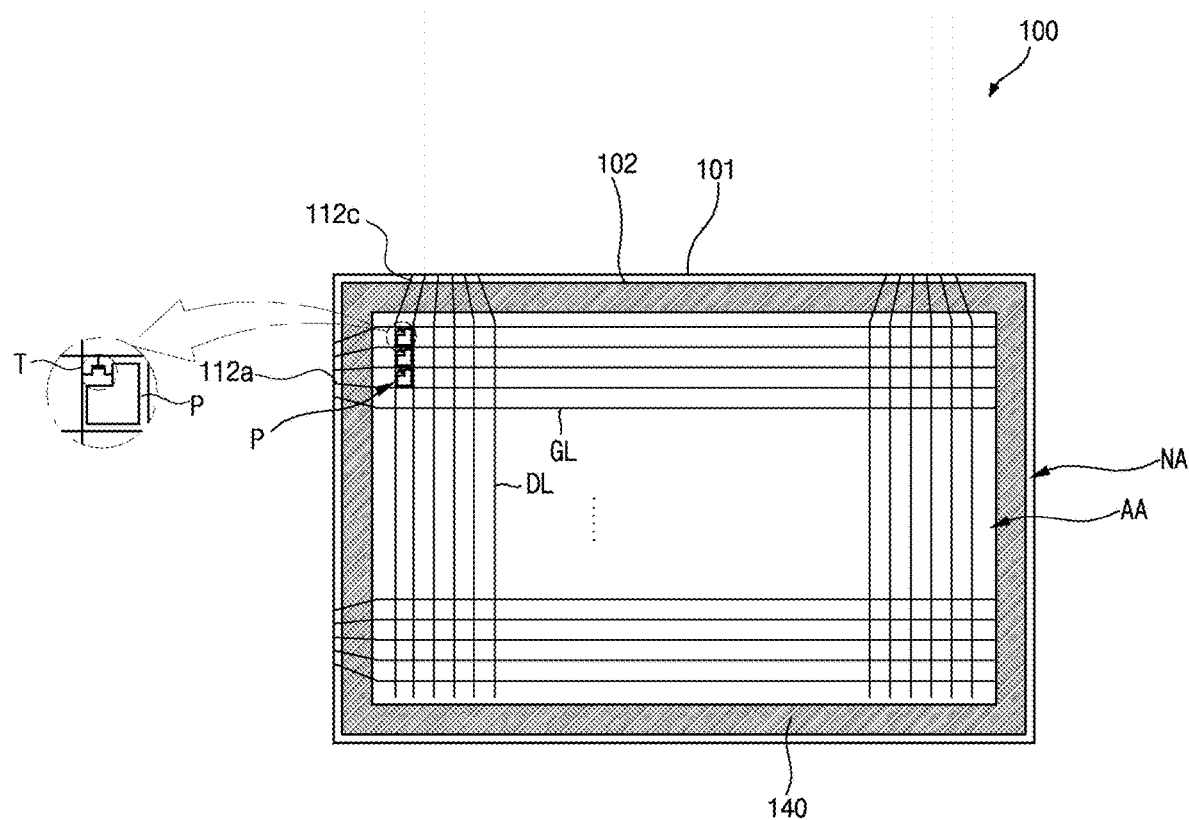
FIG. 1 is a plan view showing a liquid crystal display device according to a first embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the present disclosure is only defined by scopes of claims.

A shape, a size, a ratio, an angle, and a number disclosed in the drawings for describing embodiments of the present disclosure are merely an example. Thus, the present disclosure is not limited to the illustrated details. Like reference numerals refer to like elements throughout. In the following description, when the detailed description of the relevant known function or configuration is determined to unnecessarily obscure an important point of the present disclosure, the detailed description of such known function or configuration may be omitted. In a case where terms "comprise," "have," and "include" described in the present specification are used, another part may be added unless a more limiting term, such as "only," is used. The terms of a singular form may include plural forms unless referred to the contrary.

In construing an element, the element is construed as including an error or tolerance range even where no explicit description of such an error or tolerance range. In describing a position relationship, when a position relation between two parts is described as, for example, "on," "over," "under," or "next," one or more other parts may be disposed between the two parts unless a more limiting term, such as "just" or "direct(ly)," is used.

In describing a time relationship, when the temporal order is described as, for example, "after," "subsequent," "next," or "before," a case which is not continuous may be included unless a more limiting term, such as "just," "immediate(ly)," or "direct(ly)," is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms like "first," "second," "A," "B," "(a)," and "(b)" may be used. These terms are merely for differentiating one element from another element, and the essence, sequence, order, or number of a corresponding element should not be limited by the terms. Also, when an element or layer is described as being "connected," "coupled," or "adhered" to another element or layer, the element or layer can not only be directly connected or adhered to that other element or layer, but also be indirectly connected or adhered to the other element or layer with one or more intervening elements or layers "disposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and embodiments of the present disclosure are not limited thereto.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in co-dependent relationship.

Hereinafter, embodiments of the present disclosure will be described in detail with reference to the accompanying drawings.

First Embodiment

Figure 2:
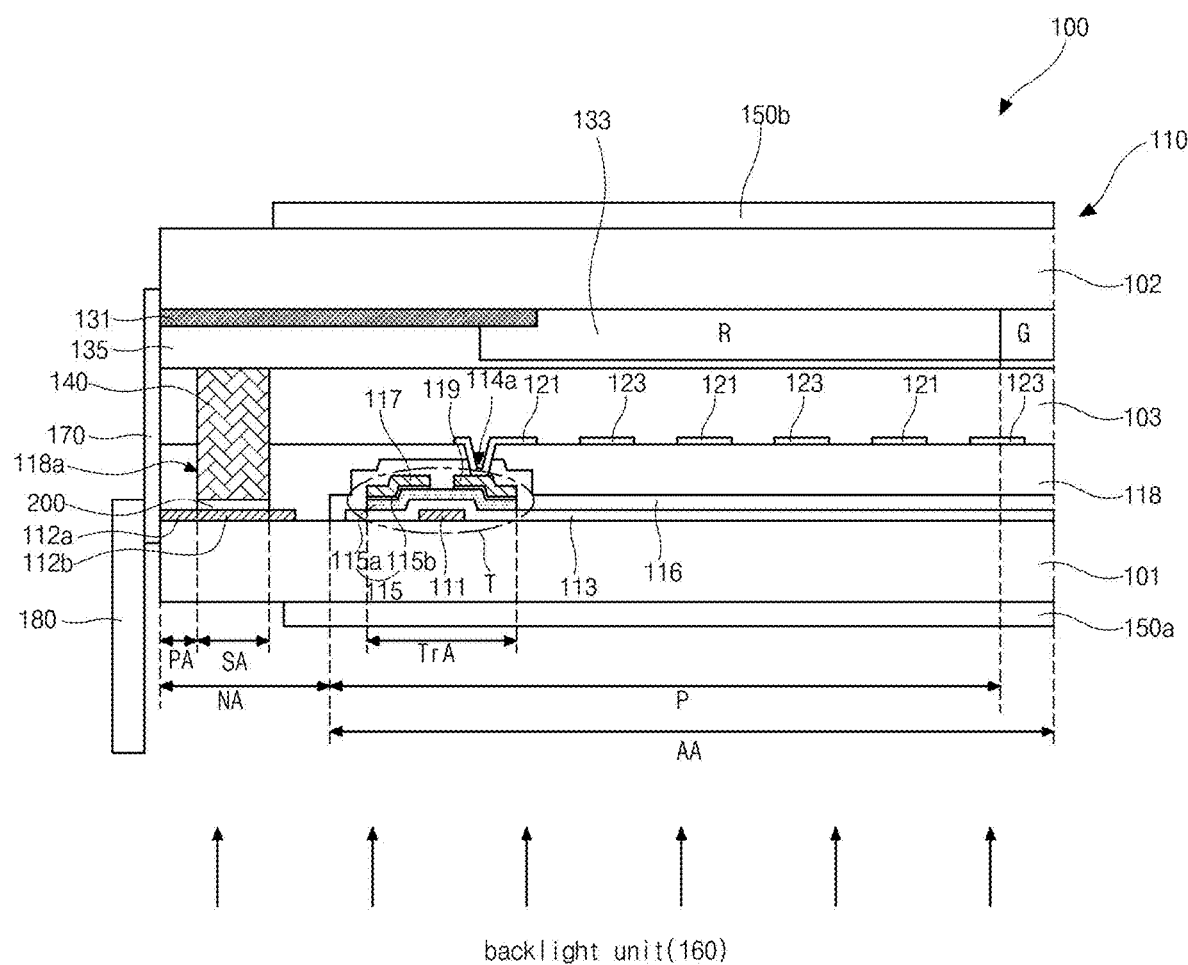
FIG. 2 is a cross-sectional view showing a portion of the liquid crystal display device according to the first embodiment of the present disclosure.
Figure 3:
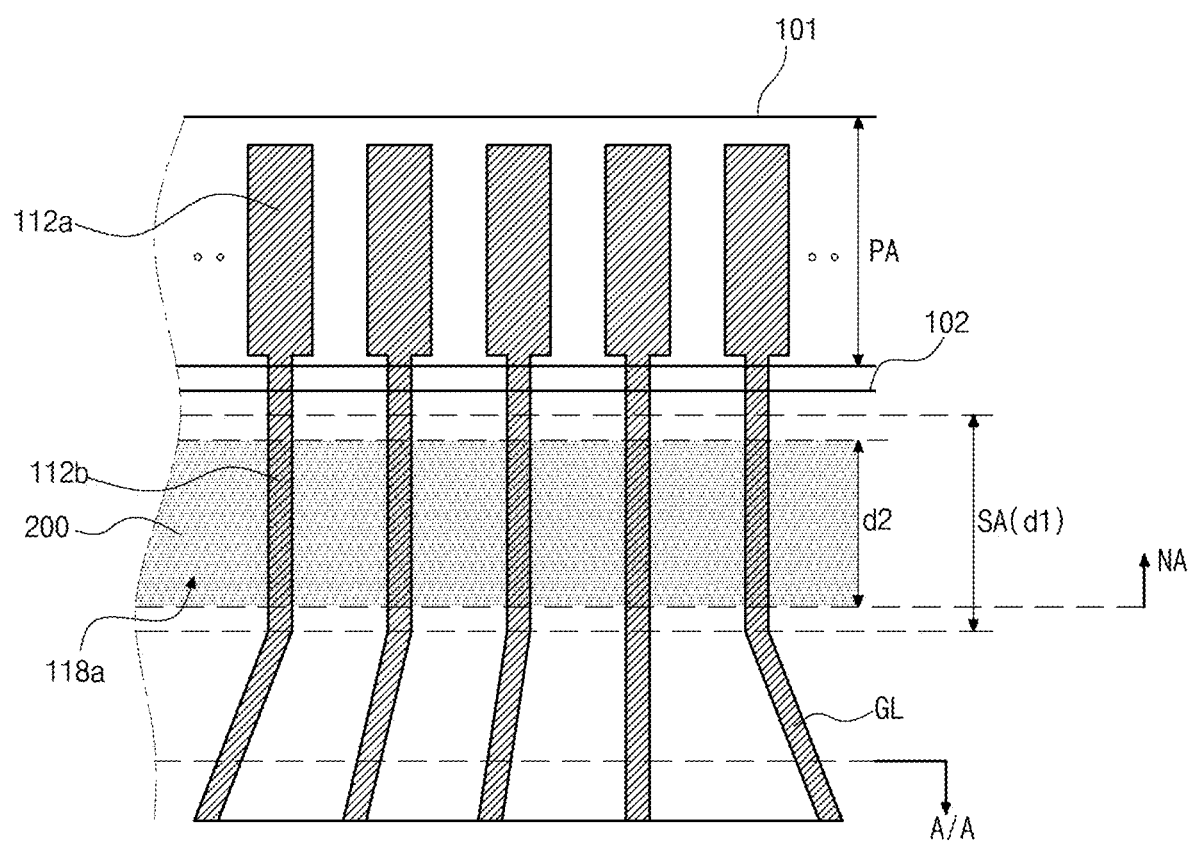
FIG. 3 is a plan view showing a non-display region of the liquid crystal display device according to the first embodiment of the present disclosure.

FIG. 1 is a plan view showing a liquid crystal display device according to a first embodiment of the present disclosure. FIG. 2 is a cross-sectional view showing a portion of the liquid crystal display device according to the first embodiment of the present disclosure. FIG. 3 is a plan view showing the non-display region of the liquid crystal display device according to the first embodiment of the present disclosure.

With reference to the example of FIG. 1, a liquid crystal display device 100 according to the first embodiment of the present disclosure may include a liquid crystal panel 110, in which an array substrate 101 and a color filter substrate 102 may be bonded to face each other with a liquid crystal layer 103 interposed therebetween. For example, a first substrate 101, which is referred to as a "lower substrate" or an "array substrate" may include a display region AA, in which an image may be displayed, and a non-display region NA, in which various types of circuits and lines may be formed and which may not be used for image display. For example, the non-display region NA may be defined along edges of the first substrate 101 and the display region AA may be positioned on an inner side of the non-display region NA.

In the display region AA of the first substrate 101, a plurality of data lines DL and a plurality of gate lines GL may cross lengthwise and widthwise to define (m×n) pixel regions P. A thin film transistor T, which may be a switching element, may be provided at an intersection of the two lines DL and GL. Further, common lines (not shown), which may pass through respective pixel regions P and may be spaced apart from the gate lines GL, may be formed.

Further, a plurality of common electrodes 123 connected to the common lines (not shown) are formed in each pixel region P to be spaced apart from each other at predetermined intervals. Further, a plurality of pixel electrodes 121 connected to the thin film transistor T may be formed in each pixel region P. For example, gate pads 112a and data pads 112c, which may be connected to the gate lines GL and the data lines DL, respectively, may be formed in the non-display region NA of one side of the first substrate 101 on which the gate lines GL and the data lines DL may be disposed, so that the gate lines GL and the data lines DL may be connected to a printed circuit board 180, which may be an external driving circuit substrate.

A second substrate 102, facing the first substrate 101 with the liquid crystal layer 103 interposed therebetween, may be referred to as an "upper substrate" or a "color filter substrate." A black matrix 131 in a lattice shape, which may cover non-display elements such as the data lines DL and the gate lines GL of the first substrate 101 and the thin film transistor T, may be formed on one surface of the second substrate 102. Further, red, green, and blue (RGB) color filter patterns 133, which may be sequentially and repeatedly arranged to correspond to the respective pixel regions P in the lattice, may be provided.

Further, first and second alignment films (not shown) for determining an initial molecular alignment direction of liquid crystals may be interposed between the two substrates 101 and 102 and the liquid crystal layer 103). A seal pattern 140 may be formed along edges of the two substrates 101 and 102 to prevent leakage of the liquid crystal layer 103, which may be filled between the first and second alignment films.

For example, in the liquid crystal display device 100 according to the first embodiment of the present disclosure, an organic insulating material film may not be positioned under the seal pattern 140, and a gate insulating pattern 200 including an inorganic insulating material may be positioned under the seal pattern 140. Accordingly, in the liquid crystal display device 100 according to the first embodiment of the present disclosure, a line width of the seal pattern 140 can be reduced, a cell gap can be maintained, and an adhesive force can be secured. For example, defects occurring in the lines positioned in the region in which the seal pattern 140 may be formed can be reduced or prevented. This will be described in more detail with reference to FIG. 2.

For convenience of description, a region in which an image is displayed may be defined as a display region AA, and a portion in a pixel region P in the display region AA, on which a thin film transistor T may be formed, may be defined as a switching region TrA. Further, a non-display region NA that may surround edges of the display region AA may be defined. The non-display region NA may be divided into a pad portion PA on which gate pads 112a may be positioned and a seal pattern region SA on which a seal pattern 140 may be positioned.

With reference to the example of FIG. 2, the liquid crystal display device 100 according to the first embodiment of the present disclosure may include the liquid crystal panel 110, first and second polarizers 150a and 150b, and a backlight 160 that may supply light to the liquid crystal panel 110. For example, in the liquid crystal panel 110, the array substrate 101, and the color filter substrate 102 may be spaced apart from and face each other, and the liquid crystal layer 103 may be interposed between the array substrate 101 and the color filter substrate 102.

For example, in the display region AA on the array substrate 101, the plurality of gate lines GL, which may be formed in parallel to be spaced apart from each other at predetermined intervals, the common lines (not shown), which may be formed parallel to the gate lines GL to be close to the gate lines GL; and the data lines DL, which may cross the gate lines GL and the common lines (not shown), and, for example, may cross the gate lines GL to define the pixel region P, may be provided. For example, the thin film transistor T may be formed in the switching region TrA, which may be an intersection of the gate lines GL and the data line DL in each pixel region P. A common electrode 123 connected to the common line (not shown) and a pixel electrode 121 connected to the thin film transistor T may be formed in an image realization region on which an image may be substantially realized in the pixel region P.

For example, the thin film transistor T may include a gate electrode 111, a gate insulating film 113, a semiconductor layer 115 including an active layer 115a of, e.g., pure amorphous silicon and an ohmic contact layer 115b of impure amorphous silicon, and source and drain electrodes 117 and 119. The pixel electrode 121 may be electrically connected to the drain electrode 119 of the thin film transistor T. For example, the pixel electrode 121 and the common electrode 123 may each be divided into a plurality of bar-shaped electrodes, which may be separately and alternately positioned and formed in the pixel region P.

Further, a protective layer 116 may be formed in the display region AA of the first substrate 101 including the thin film transistor T. A protective film 118 including an organic insulating material, such as photoacryl, may be formed above the protective layer 116 to form a flat surface, and may be formed on an entire surface of the first substrate 101. For example, a drain contact hole 114a, through which the drain electrode 119 of the thin film transistor T may be exposed, may be provided in the protective layer 116 and the protective film 118.

As a modified example, the pixel electrodes 121 may be formed in a plate shape for each pixel region P. For example, some of the pixel electrodes 121 may be formed to overlap the gate lines GL to constitute a storage capacitor (not shown).

Further, when a plurality of pixel electrodes 121 and a plurality of common electrodes 123 are formed to be spaced apart from each other in the pixel region P, the plurality of pixel electrodes 121 and the plurality of common electrodes 123 may constitute the liquid crystal panel 110, which may operate in an in-plane switching (IPS) mode. When only the plate-shaped pixel electrodes 121, except for the common electrodes 123, may be formed on the first substrate 101, the plate-shaped pixel electrodes 121 may constitute the liquid crystal panel 110, which may operate, for example, in any one of a twisted nematic (TN) mode, an electronic codebook (ECB) mode, and a vertical alignment (VA) mode. An example of the liquid crystal panel 110 that may operate in an IPS mode will be described. Further, the gate and data pads 112a and 112c connected to the gate and data lines GL and DL, respectively, may be provided on the pad portion PA of the non-display region NA of the first substrate 101.

For example, in the liquid crystal panel 110 according to the first embodiment of the present disclosure, the first substrate 101 and the second substrate 102 may be formed in the same shape so that one end of the first substrate 101 and one end of the second substrate 102 coincide with each other. Side surfaces of the gate and data pads 112a and 112c provided on the first substrate 101 may be exposed to a side surface between the first substrate 101 and the second substrate 102.

The printed circuit board 180 may be connected to one side of the liquid crystal panel 110 via a connecting member 170, such as a flexible printed circuit board. For example, the connecting member 170 may be attached and connected to a side surface of the liquid crystal panel 110. That is, the connecting member 170 may be electrically connected to the side surfaces of the gate and data pads 112a and 112c exposed to the side surface between the first substrate 101 and the second substrate 102, and the printed circuit board 180 may be connected to the connecting member 170.

Further, the black matrix 131 may be formed on the second substrate 102 facing the first substrate 101 to correspond to the gate lines GL and the data lines DL in each pixel region P and the thin film transistor T, which may be formed on the first substrate 101. Therefore, the black matrix 131 may have openings corresponding to the respective pixel regions P, and a color filter layer including the RGB color filter patterns 133, which may be sequentially and repeatedly arranged to correspond to the openings, may be formed. For example, in addition to the pixel region P in which the RGB color filter patterns 133 may be provided, a pixel region P in which white may be realized without a color filter pattern may be further included.

Further, the RGB color filter patterns 133 may be positioned above or below the thin film transistor T of the first substrate 101, other than the color filter pattern. The black matrix 131 may be formed by mutually overlapping at least two color filter patterns 133.

A transparent overcoat layer 135 may be provided on an entire surface of lower portions of the RGB color filter patterns 133. The overcoat layer 135 may function as a planarizing film for planarizing the second substrate 102 on which the color filter patterns 133 may be formed. Further, first and second alignment films (not shown), whose surfaces facing liquid crystals may each be rubbed in a predetermined direction, may be interposed between the liquid crystal layer 103 and the overcoat layer 135 of the second substrate 102 and between the liquid crystal layer 103 and the pixel electrode 121 and the common electrode 123 of the first substrate 101, so that an initial alignment state and an alignment direction of liquid crystal molecules may be uniformly aligned.

Further, a sealant may be applied on the seal pattern region SA of the non-display region NA along the edges of the first substrate 101 and the second substrate 102 to prevent leakage of the liquid crystal layer 103. The sealant may be, e.g., a polymer mixture in which an epoxy resin and a curing accelerator may be mixed, and may be cured, e.g., by heating or UV light irradiation to form the seal pattern 140 serving as an adhesive for maintaining a bonded state of the two substrates 101 and 102.

The seal pattern 140 may also serve as a gap agent for uniformly controlling a cell gap between the two substrates 101 and 102, which may be defined as a thickness of the liquid crystal layer 103. That is, the sealant may be formed in the non-display region NA, which may surround the edges of the display region AA to serve as an encapsulant for the liquid crystal panel 110.

For example, in the liquid crystal display device 100 according to the first embodiment of the present disclosure, an etched groove 118a formed by etching a portion of the protective film 118 may be provided under the seal pattern 140, and the gate insulating pattern 200 may be positioned under the etched groove 118a. The gate insulating pattern 200 may be formed to extend from the gate insulating film 113, or may have at least one island shape to correspond to the etched groove 118a.

In the liquid crystal display device 100 according to the first embodiment of the present disclosure, the line width of the seal pattern 140 can be reduced, the cell gap can be maintained, and an adhesive force can be secured by the etched groove 118a and the gate insulating pattern 200. For example, defects occurring in a gate link line 112b positioned in the region in which the seal pattern 140 may be formed can be prevented.

For example, the sealant may be applied on the seal pattern region SA of the non-display region NA along edges of one selected from the first substrate 101 and the second substrate 102 to form the seal pattern 140. For example, an amount of the sealant applied on the substrates 101 and 102 may be designed to be reduced or minimized in a known process. However, the seal pattern 140 having a line width that is thick to implement a recently required narrow bezel may be formed with the amount of the sealant.

Therefore, in the liquid crystal display device 100 according to the first embodiment of the present disclosure, the etched groove 118a is formed in the protective film 118 so that a cross sectional area of the seal pattern 140 may be minimized and the line width of the seal pattern 140 may be reduced while maintaining the cell gap, even when the same amount of sealant is applied on the substrates 101 and 102. That is, the seal pattern 140 of a narrow seal may be formed. Accordingly, the liquid crystal display device 100 having a narrow bezel may be provided by reducing the seal pattern region SA of the non-display region NA.

Further, as the cross sectional area of the seal pattern 140 of the narrow seal may be reduced or minimized, an attachment area may also be reduced so that adhesion with the substrates 101 and 102 may become low. When the adhesion of the seal pattern 140 and the substrates 101 and 102 becomes low, the degradation of durability against moisture or contaminants that can be introduced from the outside may cause occurrence of stains around the seal pattern 140 or occurrence of breakage of the seal pattern 140 or leakage of the liquid crystal.

For example, in the liquid crystal display device 100 according to the first embodiment of the present disclosure, the etched groove 118a may be provided in the protective film 118. Thus, a contact area of the seal pattern 140 may be increased by the etched groove 118a, and a contact area of the seal pattern 140 and the first substrate 101 may be sufficiently secured.

Further, when an adhesive force of the protective film 118 including an organic insulating material and an adhesive force of the seal pattern 140 are low, the etched groove 118a may be formed in the protective film 118 so that the protective film 118 including an organic insulating material and a lower portion of the seal pattern 140 may not be in contact with each other, and the gate insulating pattern 200 provided in the etched groove 118a may be in contact with the seal pattern 140. Thus, the adhesive force of the seal pattern 140 may be secured.

For example, in the liquid crystal display device 100 according to the first embodiment of the present disclosure, the etched groove 118a may be provided in the protective film 118. Thus, defects occurring in the gate link line 112b positioned in the seal pattern region SA can be prevented while reducing the line width of the seal pattern 140, maintaining the cell gap, and securing the adhesive force.

That is, the gate link line 112b for connecting the gate pad 112a to the gate line GL may be positioned to correspond to the seal pattern region SA. When the etched groove 118a is provided in the protective film 118 to reduce the cross sectional area of the seal pattern 140, the gate link line 112b positioned in the seal pattern region SA may be exposed to the outside by the etched groove 118a.

For example, in the liquid crystal display device 100 according to the first embodiment of the present disclosure, the gate insulating pattern 200 may be positioned in the etched groove 118a of the protective film 118. Thus, the gate link line 112b positioned to correspond to the seal pattern region SA may be prevented from being exposed to the outside by the etched groove 118a, even when the etched groove 118a is provided in the protective film 118.

Therefore, damage of the gate link line 112b may be prevented during the process of oxidization of the gate link line 112b or formation of the seal pattern 140. Thus, defects occurring in the gate link line 112b can be reduced or prevented.

With reference to the example of FIG. 3, in the display region AA on the first substrate 101, in which an image may be displayed, the plurality of gate lines GL may be formed to extend in a first direction and the data lines DL, which may extend in a second direction crossing the first direction, and may define the pixel region P together with the gate lines GL, may be formed. Further, in the pad portion PA of the non-display region NA on an outer side of the display region AA, the plurality of gate pads 112a may be formed on one ends of the plurality of gate lines GL and the gate pads 112a may be electrically connected to the gate lines GL through the gate link line 112b. For example, although not shown in FIG. 3, the plurality of data pads 112c connected to the ends of the data lines DL may be positioned at the other side of the first substrate 101.

Alternatively, all of the gate and data pads 112a and 112c may be positioned at one side of the first substrate 101. In the first embodiment of the present disclosure, an example in which the gate pads 112a and the data pads 112c are respectively positioned at one side and the other side of the first substrate 101 will be described.

Further, in the non-display region NA, which may surround the edges of the display region AA, the seal pattern region SA to be bonded to the second substrate 102 may be positioned. That is, the seal pattern region SA may be positioned between the pad portion PA and the display region AA, and may be positioned together with a line to which the second substrate 102 may be bonded.

In the liquid crystal display device 100 according to the first embodiment of the present disclosure, the etched groove 118a may be provided by removing a portion of the protective film 118 including an organic insulating material, which may be in the seal pattern region SA between the pad portion PA and the display region AA. The gate insulating pattern 200 may be above the gate link line 112b exposed by the etched groove 118a.

For example, a first width d1 of the etched groove 118a may be equal to a width of the seal pattern region SA, and may be less than or equal to a width of the seal pattern 140. A second width d2 of the gate insulating pattern 200 in the etched groove 118a may be greater than or equal to the first width d1 of the etched groove 118a.

Further, although not shown, the gate insulating pattern 200 may be formed to correspond to each gate link line 112b. For example, the gate insulating pattern 200 may have a width greater than a width of the gate link line 112b exposed to the etched groove 118a.

For example, when the width d1 of the etched groove 118a is formed to be greater than the width of the seal pattern region SA, the cross sectional area of the seal pattern 140 may be increased so that it may be difficult to implement a narrow seal and may also be difficult to maintain a constant cell gap. Further, when the width d2 of the gate insulating pattern 200 in the etched groove 118a is formed to be smaller than the width of the etched groove 118a, or the width d2 of the gate insulating pattern 200 is formed to be smaller than the width of the gate link line 112b, the gate link line 112b may be exposed between the gate insulating pattern 200 and the etched groove 118a, which may cause a defect of the gate link line 112b.

As described above, in the liquid crystal display device 100 according to the first embodiment of the present disclosure, the etched groove 118a may be provided by etching a portion of the protective film 118, including an organic insulating material to correspond to the seal pattern region SA and the gate insulating pattern 200, may be positioned in the etched groove 118a. Thus, the line width of the seal pattern 140 can be reduced, the cell gap can be maintained, and the adhesive force can be secured. For example, the defects occurring in the line, such as the gate link line 112b in the seal pattern region SA, can be prevented.

Hereinafter, a method of manufacturing the first substrate for the liquid crystal display device according to the first embodiment of the present disclosure having the above-described planar and sectional configuration will be described.

FIGS. 4A to 4F are cross-sectional views showing processes of manufacturing a first substrate for the liquid crystal display device according to the first embodiment of the present disclosure. FIG. 5 is a cross-sectional view showing another structure of a protective layer according to the first embodiment of the present disclosure.

Here, in addition to the method of manufacturing the first substrate for the liquid crystal display device according to the first embodiment of the present disclosure, a jumping structure for electrically connecting a gate pattern to a source-drain pattern will also be described. For example, in the first substrate for the liquid crystal display device according to the first embodiment of the present disclosure, a gate driving integrated circuit (IC) may be formed on the first substrate in the process of forming the first substrate, without separately mounting the gate driving IC, when the liquid crystal display device is manufactured. For example, it may be desirable to electrically connect conductive materials formed on different layers to each other. For example, it may be desirable to configure a jumping structure for electrically connecting the gate pattern and the source-drain pattern.

For example, a gate-in-panel (GIP) structure, in which a portion of a gate driving IC of a liquid crystal display device may be simultaneously formed with a first substrate in a process of manufacturing the first substrate, will be described. For example, connection lines for transmitting signals, such as a gate signal pulse (GSP), gate enable (GE), gate signal clock (GSC), and the like, to a gate layer may be formed on the first substrate in a line-on-glass (LOG) method. Further, the connection lines may be connected to a source portion of a thin film transistor of the gate driving IC.

Figure 4A:
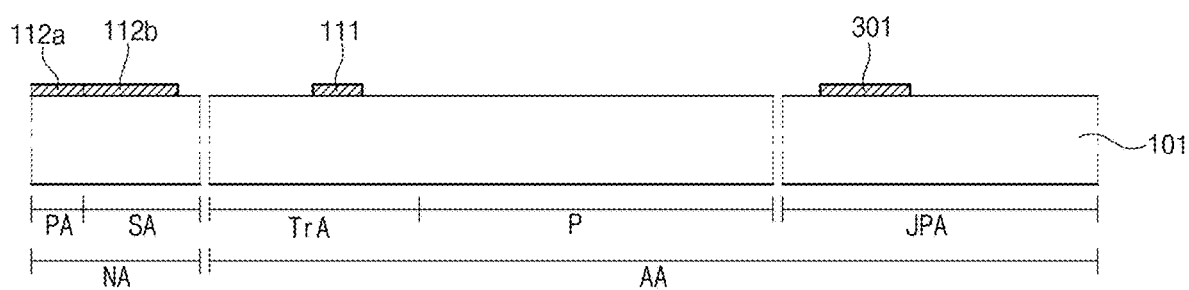
FIGS. 4A to 4F are cross-sectional views showing processes of manufacturing a first substrate for the liquid crystal display device according to the first embodiment of the present disclosure.
Figure 5:
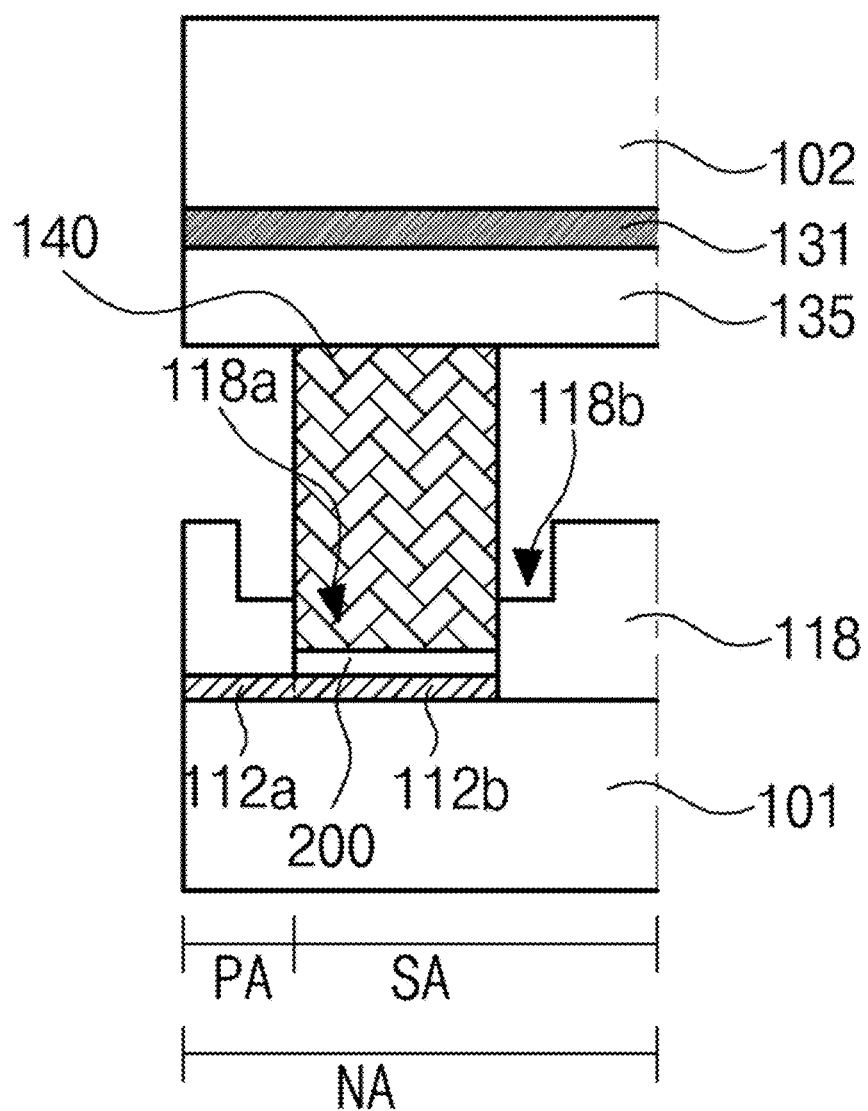
FIG. 5 is a cross-sectional view showing another structure of a protective layer according to the first embodiment of the present disclosure.

As shown in the example of FIG. 4A, a low resistance metal material, for example, one or more of: aluminum (Al), an aluminum alloy, e.g., aluminum neodymium (AlNd), copper (Cu), a copper alloy, molybdenum (Mo), and/or a molybdenum alloy, e.g., molybdenum titanium (MoTi), may be deposited on an entire surface of a transparent insulating substrate 101 to form a first metal layer (not shown).

Thereafter, the first metal layer (not shown) may be patterned by performing a mask process including a series of unit processes, such as application of a photoresist, exposure using a photomask, development of an exposed photoresist, etching of the first metal layer (not shown), and stripping of a photoresist, so that the plurality of gate lines GL having a single layer structure or a multilayer structure and extending in a first direction may be formed.

At the same time, a gate electrode 111 connected to the gate lines GL may be formed in each switching region TrA. For example, the gate electrode 111 provided in each switching region TrA may be formed to be branched from the gate line GL or may be formed as the gate line GL, itself, having a greater width than that of another region.

Further, a gate pad 112a may be formed at an end of each gate line GL in the pad portion PA of the non-display region NA. A gate link line 112b for connecting the gate line GL and the gate pad 112a may be formed in the seal pattern region SA of the non-display region NA. For example, a gate pattern 301 may be formed in a jumping portion JPA.

Figure 4B:
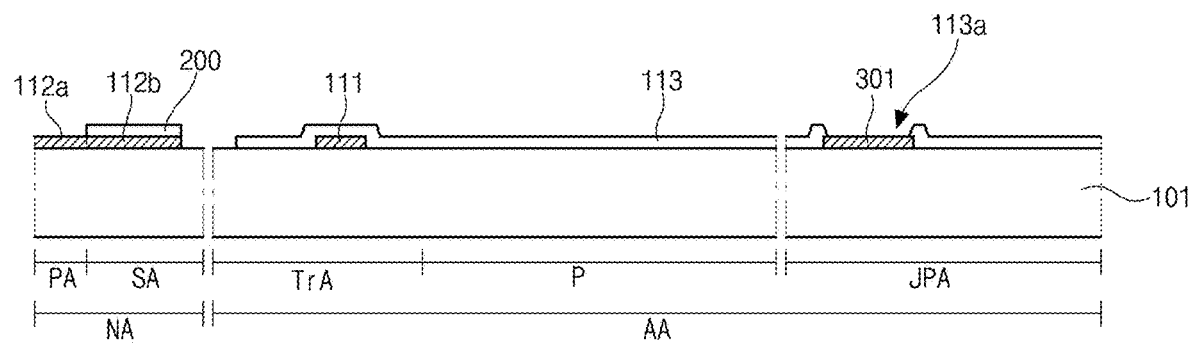

Next, an inorganic insulating material, for example, silicon oxide (SiO$_2$) or silicon nitride (SiN$_x$), may be deposited above the gate lines GL, the gate electrode 111, the gate pad 112a, the gate link line 112b, and the gate pattern 301 to form a gate insulating film 113 on an entire surface of the first substrate 101. Thereafter, as shown in the example of FIG. 4B, the gate insulating film 113 may be patterned by performing a mask process so that a gate insulating pattern 200, which may cover the gate link line 112b, may be formed in the seal pattern region SA. A gate pattern contact hole 113a, through which the gate pattern 301 may be exposed, may be formed in the jumping portion JPA. For example, the gate insulating pattern 200 may be formed to be connected to the gate insulating film 113, may be formed in one island shape corresponding to the seal pattern region SA, or may be formed in a plurality of island shapes corresponding to the respective gate link lines 112b.

Next, a pure amorphous silicon layer (not shown) and an impure amorphous silicon layer (not shown) may be formed above the gate insulating film 113 and the gate insulating pattern 200. Low resistance metal materials, for example, one or more of: aluminum (Al), an aluminum alloy, e.g., aluminum neodymium (AlNd), copper (Cu), a copper alloy, molybdenum (Mo), and/or a molybdenum alloy, e.g., molybdenum titanium (MoTi), may be deposited on an entire surface of the impure amorphous silicon layer (not shown) to form a second metal layer (not shown).

Figure 4C:
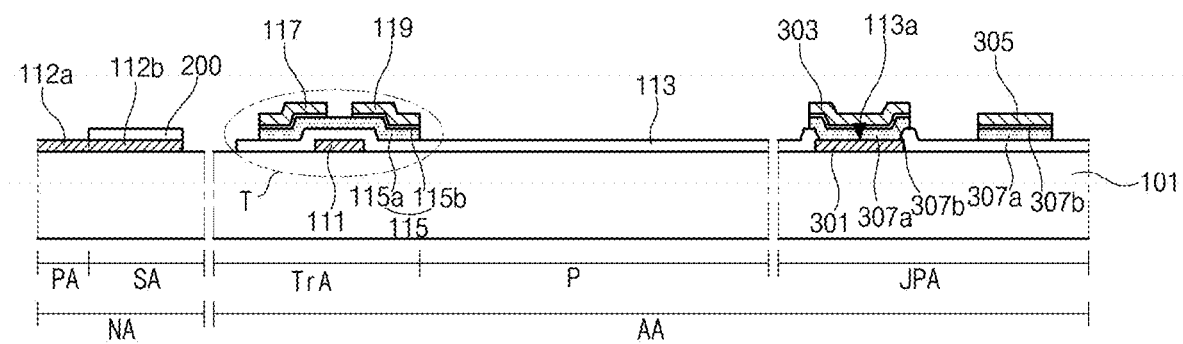

Thereafter, as shown in the example of FIG. 4C, a photoresist layer (not shown) may be formed on the second metal layer (not shown), the second metal layer (not shown) may be etched and removed by performing halftone exposure or diffraction exposure on the photoresist layer (not shown), and the impure amorphous silicon layer (not shown) formed under the second metal layer (not shown) may be subsequently etched. For example, a portion of the pure amorphous silicon layer (not shown) formed under the second metal layer (not shown) may be etched and the pure amorphous silicon layer (not shown) may be partially exposed to an upper portion of the gate electrode 111 in the switching region TrA.

Therefore, source and drain electrodes 117 and 119 may be formed above the gate electrode 111 in the switching region TrA. The source and drain electrodes 117 and 119 may be spaced a particular interval from each other, and may face each other. An ohmic contact layer 115b of the impure amorphous silicon layer (not shown) may be under the source and drain electrodes 117 and 119, and an active layer 115a of the pure amorphous silicon layer (not shown) may be under the ohmic contact layer 115b.

For example, although not shown, the data lines DL, which may cross the gate lines GL on the gate insulating film 113 to define the pixel region P, may be formed. The data pads 112c and data pad link lines (not shown), which may be electrically connected to the data lines DL, may be simultaneously formed in the non-display region NA. Further, a first source-drain pattern 303, which may contact the gate pattern 301 through the gate pattern contact hole 113a, may be formed above the gate insulating film 113 in the jumping portion JPA, and a second source-drain pattern 305 may be formed above the gate insulating film 113.

For example, due to the characteristics of the manufacturing process, first and second dummy patterns 307a and 307b of pure and impure amorphous silicon may be formed between the first and second source-drain patterns 303 and 305 and the gate insulating film 113 in a completely overlapping manner with the first and second source-drain patterns 303 and 305, respectively. For example, the gate electrode 111, the gate insulating film 113, and the semiconductor layer 115 including the active layer 115a and the ohmic contact layer 115b, which may be sequentially stacked in the switching region TrA, and the source and drain electrodes 117 and 119, which may be positioned above the semiconductor layer 115 to be spaced apart from each other, may constitute the thin film transistor T, which may be a switching element.

Next, a protective layer 116 may be formed above the source and drain electrodes 117 and 119 and the exposed ohmic contact layer 115b in the switching region TrA and the first and second source-drain patterns 303 and 305 in the jumping portion JPA. The protective layer 116 may be formed on an entire surface of the first substrate 101.

Subsequently, photoacryl, which is an organic insulating material, may be applied on the entire surface of the first substrate 101 over the protective layer 116, although embodiments are not limited to this example material. The protective layer 116 may be patterned by performing a mask process thereon, so that a protective film 118 having a flat surface may be formed to correspond to the display region AA.

Figure 4D:
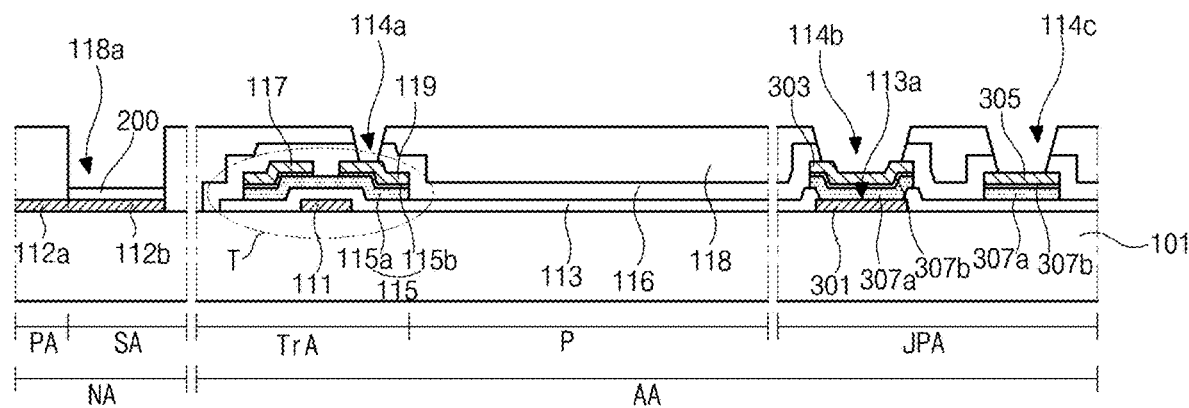

Thereafter, as shown in the example of FIG. 4D, the protective layer 116, which may be deposited on the entire surface of the first substrate 101, and the protective film 118 may be patterned by performing a mask process, so that a drain contact hole 114a, through which a portion of the drain electrode 119 of the thin film transistor T in each pixel region P may be exposed, may be formed in the display region AA and first and second jumping contact holes 114b and 114c, through which the first source-drain pattern 303 and the second source-drain pattern 305 may be exposed, may be formed in the jumping portion JPA. For example, an etched groove 118a, through which the gate insulating pattern 200 may be exposed, may be formed in the protective film 118 to correspond to the seal pattern region SA of the non-display region NA.

Figure 4E:
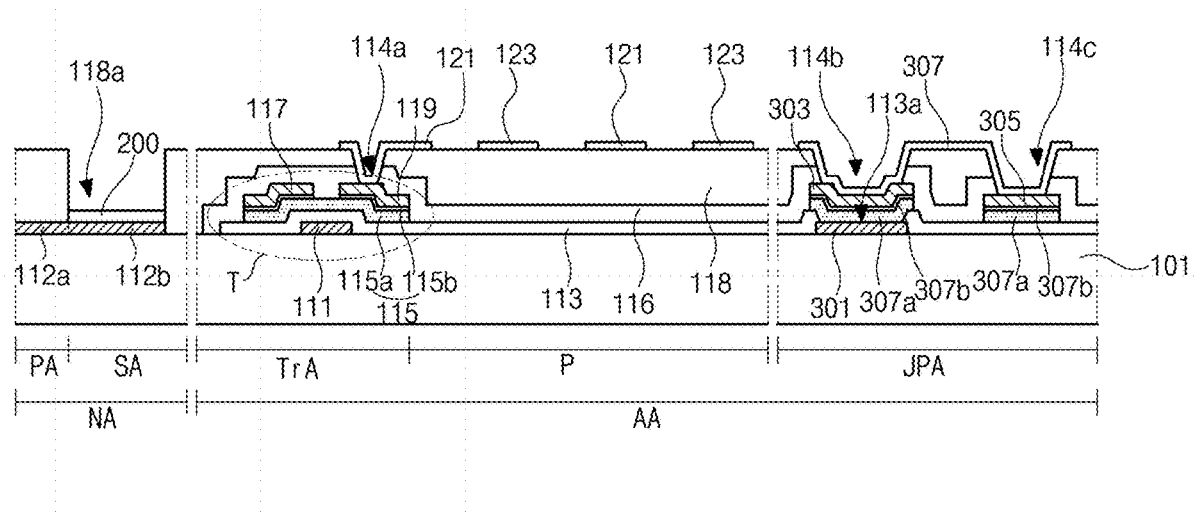

Next, as shown in the example of FIG. 4E, one of, e.g., indium tin oxide (ITO) and indium zinc oxide (IZO), which are transparent conductive materials, may be deposited on an entire surface of an upper portion of the protective film 118. The protective film 118 may be patterned by performing a mask process thereon, so that a plurality of pixel electrodes 121, which may be connected to the drain electrode 119 of the thin film transistor T through the drain contact hole 114a, may be formed to correspond to the pixel region P.

Further, common electrodes 123, which may be separately and alternately positioned with the pixel electrodes 121 in the pixel region P, may be formed. Further, a jumping electrode 307, for connecting the first source-drain pattern 303 and the second source-drain pattern 305 through the first and second jumping contact holes 114b and 114c, may be formed in the jumping portion JPA. Therefore, the first substrate 101 for the liquid crystal display device according to the first embodiment of the present disclosure may be completely formed.

Figure 4F:
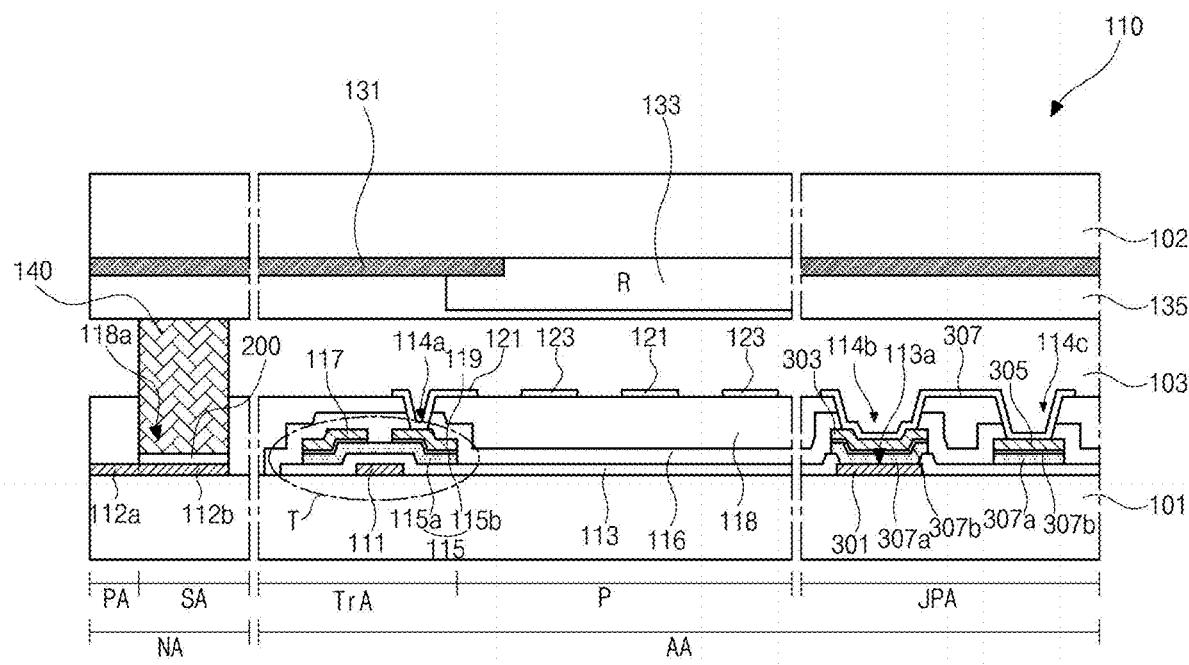

Thereafter, as shown in the example of FIG. 4F, a second substrate 102, including a black matrix 131, a color filter pattern 133, and an overcoat layer 135 may be prepared, a sealant may be applied on the seal pattern region SA of the non-display region NA of the first substrate 101 or on the second substrate 102, and then a liquid crystal layer 103 may be interposed between the first substrate 101 and the second substrate 102 to bond the first substrate 101 and the second substrate 102. Thus a liquid crystal panel 110 is completely manufactured.

For example, the sealant applied on the seal pattern region SA may be cured to maintain the bonded state of the two substrates 101 and 102. For example, a seal pattern 140 may be positioned in the etched groove 118a of the protective film 118 of the first substrate 101, and may be brought into contact with the gate insulating pattern 200 exposed by the etched groove 118a.

Accordingly, in the liquid crystal display device 100 according to the first embodiment of the present disclosure, a portion of the protective film 118 including an organic insulating material may be etched to correspond to the seal pattern region SA to provide the etched groove 118a, and the gate insulating pattern 200, including an inorganic insulating material, may be positioned in the etched groove 118a. Thus, a cell gap can be maintained, and an adhesive force can be secured, while reducing a line width of the seal pattern 140. For example, defects occurring in a line, such as the gate link line 112b positioned in the seal pattern region SA, can be reduced or prevented.

With reference to the example of FIG. 5, a stepped portion 118b may be further provided around the etched groove 118a of the protective film 118. Even when pressure is applied to the sealant by the bonding pressure in the process of bonding the first and second substrates 101 and 102 after the sealant is applied on the seal pattern region SA of the first substrate 101 and the second substrate 102, the stepped portion 118b may reduce or prevent the sealant from being introduced into the display region AA.

Further, the stepped portion 118b may also guide the sealant to be accurately positioned in the etched groove 118a of the protective film 118. That is, when the sealant is applied on the second substrate 102, the first and second substrates 101 and 102 may be accurately aligned and bonded to each other, such that the sealant applied on the second substrate 102 may be positioned in the etched groove 118a of the protective film 118 of the first substrate 101. For example, the stepped portion 118b may be formed around the etched groove 118a of the protective film 118 of the first substrate 101 so that the sealant applied on the second substrate 102 may be guided into the etched groove 118a by the stepped portion 118b. For example, the stepped portion 118b may have any depth that is smaller than a height of the protective film 118. However, the stepped portion 118b may be formed such that the gate pad 112a positioned in the pad portion PA may not be exposed to the outside. A width of the stepped portion 118b is not limited. However, the stepped portion 118b may be in the non-display region NA. For example, the stepped portion 118b may be formed within a size and shape range not greatly deviating from the seal pattern region SA.

Second Embodiment

Figure 6:
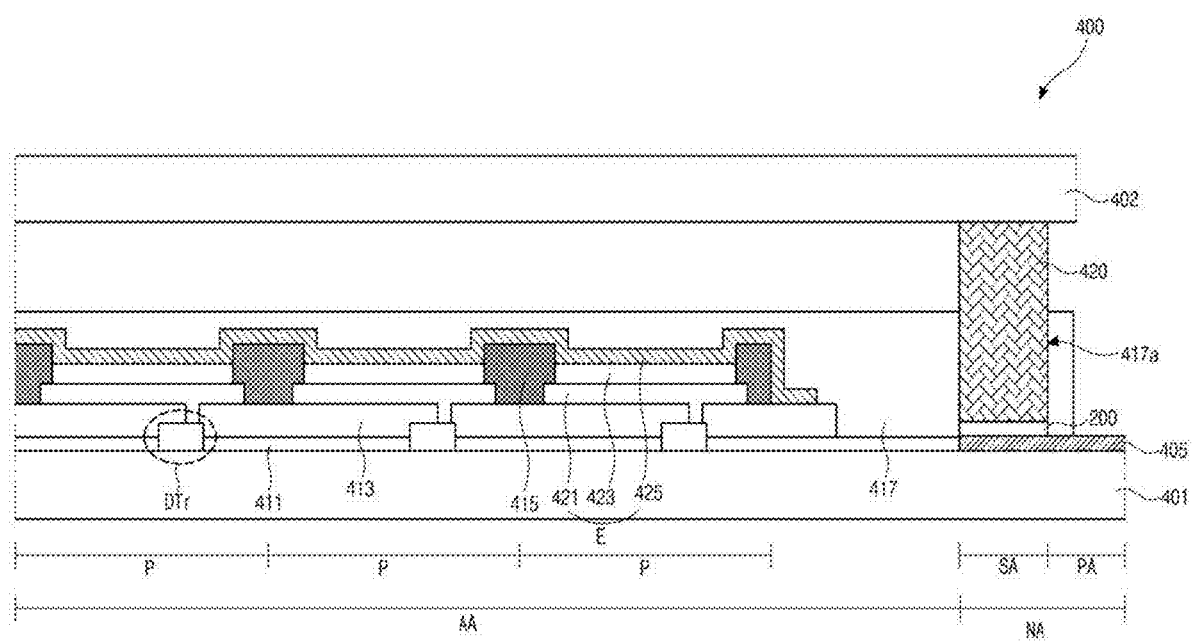
FIG. 6 is a cross-sectional view showing an organic light-emitting display device according to a second embodiment of the present disclosure.

FIG. 6 is a cross-sectional view showing an organic light-emitting display device according to a second embodiment of the present disclosure.

With reference to the example of FIG. 6, an organic light-emitting display device 400 according to the second embodiment of the present disclosure may include a first substrate 401, on which a driving thin film transistor DTr and a light-emitting diode E may be formed, and a second substrate 402 facing the first substrate 401. The first and second substrates 401 and 402 may be bonded to be spaced apart from each other to form a display panel. For example, although not shown, the driving thin film transistor DTr may be formed above the first substrate 401 in a display region AA for each pixel region P. A first electrode 421 connected to each driving thin film transistor DTr, an organic light-emitting layer 423, which may emit light of a specific color to an upper portion of the first electrode 421, and a second electrode 425 formed above the organic light-emitting layer 423, may be provided.

For example, although not shown, the driving thin film transistor DTr may include source and drain electrodes (not shown), a semiconductor layer (not shown) including source and drain regions (not shown) in contact with the source and drain electrodes (not shown), and a gate insulating film 411 and a gate electrode (not shown), which may be above the semiconductor layer (not shown).

A protective layer 413 may be above the driving thin film transistor DTr, and the first electrode 421, which may be connected to the drain electrode (not shown) of the driving thin film transistor DTr and may form an anode of the light-emitting diode E with, for example, a material having a relatively high work function value, may be positioned above the driving thin film transistor DTr.

The first electrode 421 may be provided for each pixel region P. A bank 415 may be provided between the first electrodes 421 positioned in the respective pixel regions P.

The organic light-emitting layer 423 may be above the first electrode 421. The organic light-emitting layer 423 may be configured as a single layer including a luminescent material, or may be configured as multiple layers of a hole injection layer, a hole transport layer, an emitting material layer, an electron transport layer, and an electron injection layer, e.g., to increase luminous efficiency. Further, the second electrode 425, which may form a cathode, may be on an entire surface of an upper portion of the organic light-emitting layer 423.

In the organic light-emitting display device 400, when a predetermined voltage is applied to the first electrode 421 and the second electrode 425 according to a selected signal, holes injected from the first electrode 421 and electrons provided from the second electrode 425 may be transported to the organic light-emitting layer 423 to form an exciton. When such an exciton is transitioned from an excited state to a ground state, light may be generated and emitted in the form of visible light. For example, the emitted light may pass through the transparent first electrode 421 or the second electrode 425 so that an arbitrary image may be realized in the organic light-emitting display device 400.

Further, a protective film 417 may be above the driving thin film transistor DTr and the light-emitting diode E, e.g., in the form of a thin film. The protective film 417 may include an organic insulating material to reduce or prevent external oxygen and moisture from permeating into the organic light-emitting display device 400.

The second substrate 402 may be above the first substrate 401. A seal pattern 420 may be interposed between the first and second substrates 401 and 402 along the non-display region NA corresponding to an edge between the first and second substrates 401 and 402 so that the first and second substrates 401 and 402 may be bonded to each other. Therefore, the organic light-emitting display device 400 may be encapsulated.

A pad 405 for receiving power from an external driving unit (not shown) may be in the pad portion PA of the non-display region NA of the first substrate 401. The pad 405 may be connected to an external driving circuit substrate (e.g., a printed circuit board, not shown).

For example, a portion of the pad 405 may be in the seal pattern region SA on which the seal pattern 420 may be formed. For example, in the organic light-emitting display device 400 according to the second embodiment of the present disclosure, a portion of the protective film 417 may be etched so that the protective film 417 including an organic insulating material may not be in the seal pattern region SA, to form an etched groove 417a, and a gate insulating pattern 200 including an inorganic insulating material may be under the etched groove 417a.

Accordingly, in the organic light-emitting display device 400 according to the second embodiment of the present disclosure, a cell gap can be maintained and an adhesive force can be secured while reducing a line width of the seal pattern 420. For example, defects occurring in the pad 405 positioned in the region on which the seal pattern 420 is formed can be reduced or prevented.

For example, although not shown, in the organic light-emitting display device 400 according to the second embodiment of the present disclosure, the second electrode 425 and the organic light-emitting layer 423 of the light-emitting diode E may be provided on the second substrate 402, and may be electrically connected to the first electrode 421 positioned on the first substrate 401 through a connection pattern (not shown). The organic light-emitting layer 423 formed for each pixel region P may emit red, green, or blue light, or the organic light-emitting layer 423 may emit white light and may include a color filter (not shown) for each pixel region P.

As described above, according to an embodiment of the present disclosure, a portion of a protective film including an organic insulating material may be etched to correspond to a seal pattern region to form an etched groove, and a gate insulating pattern may be in the etched groove, so that a line width of a seal pattern can be reduced, a cell gap can be maintained, and an adhesive force can be secured. For example, defects occurring in a line positioned in the seal pattern region can be reduced or prevented.

It will be apparent to those skilled in the art that various modifications and variations may be made in the present disclosure without departing from the technical idea or scope of the disclosure. Thus, it may be intended that embodiments of the present disclosure cover the modifications and variations of the disclosure provided they come within the scope of the appended claims and their equivalents.

What is claimed is:

1. A display device, comprising:
   a first substrate and a second substrate spaced apart from and facing each other;
   a seal pattern on the first substrate at an edge between the first and second substrates;
   a gate insulating pattern comprising an inorganic insulating material, the gate insulating pattern contacting the seal pattern on the first substrate;
   a protective film comprising an organic insulating material and comprising an etched groove through which the gate insulating pattern is exposed;
   a thin film transistor on the first substrate, the thin film transistor comprising a gate electrode;
   a gate insulating film on the gate electrode;
   a semiconductor layer on the gate insulating film;
   a source electrode and a drain electrode on the semiconductor layer, wherein the gate insulating pattern extends from the gate insulating film;
   a gate pattern on the first substrate, the gate pattern comprising a same material in a same layer as the gate electrode;
   a gate pattern contact hole in the gate insulating film, the gate pattern being exposed through the gate pattern contact hole;
   a first source-drain pattern on the gate insulating film, the first source-drain pattern directly contacting the gate pattern through the gate pattern contact hole and comprising a same material in a same layer as the source electrode and the drain electrodes; and
   a second source-drain pattern on the gate insulating film, the first source-drain pattern being connected to the second source-drain pattern via a jumping electrode.

2. The display device of claim 1, wherein a width of the etched groove is less than or equal to a width of the seal pattern.

3. The display device of claim 1, wherein a width of the gate insulating pattern is greater than or equal to a width of the etched groove.

4. The display device of claim 1, wherein the gate insulating pattern has an island shape corresponding to each line positioned under the seal pattern.

5. The display device of claim 1, wherein:
   the protective film, comprising first and second jumping contact holes through which the first and second source-drain patterns are exposed, is on the first and second source-drain patterns; and
   the jumping electrode is connected to the first and second source-drain patterns through the first and second jumping contact holes.

6. The display device of claim 1, further comprising, on the second substrate:
a black matrix; and
a color filter.

7. The display device of claim 1, further comprising:
a light-emitting diode on the thin film transistor, the light-emitting diode comprising:
a first electrode on the thin film transistor, the first electrode being connected to the drain electrode;
an organic light-emitting layer on the first electrode; and
a second electrode sequentially disposed on the organic light-emitting layer.

8. The display device of claim 1, further comprising a stepped portion around the etched groove.

9. A method of manufacturing a display device, the method comprising:
providing a first substrate and a second substrate spaced apart from and facing each other;
providing a seal pattern on the first substrate at an edge between the first and second substrates;
providing a gate insulating pattern comprising an inorganic insulating material, the gate insulating pattern directly contacting the seal pattern on the first substrate;
providing a protective film comprising an organic insulating material and comprising an etched groove through which the gate insulating pattern is exposed;
providing a thin film transistor on the first substrate, the providing the thin film transistor comprising providing a gate electrode;
providing a gate insulating film on the gate electrode;
providing a semiconductor layer on the gate insulating film; and
providing a source and a drain electrode on the semiconductor layer, wherein the gate insulating pattern extends from the gate insulating film;
providing a gate pattern on the first substrate, the gate pattern comprising a same material in a same layer as the gate electrode;
providing a gate pattern contact hole in the gate insulating film, the gate pattern being exposed through the gate pattern contact hole;
providing a first source-drain pattern on the gate insulating film, the first source-drain pattern directly contacting the gate pattern through the gate pattern contact hole and comprising a same material in a same layer as the source and drain electrodes; and
providing a second source-drain pattern on the gate insulating film, the first source-drain pattern being connected to the second source-drain pattern via a jumping electrode.

10. The method of claim 9, wherein a width of the etched groove is less than or equal to a width of the seal pattern.

11. The method of claim 9, wherein a width of the gate insulating pattern is greater than or equal to a width of the etched groove.

12. The method of claim 9, wherein the gate insulating pattern has an island shape corresponding to each line positioned under the seal pattern.

13. The method of claim 9, wherein:
the protective film, comprising first and second jumping contact holes through which the first and second source-drain patterns are exposed, is provided on the first and second source-drain patterns; and
the jumping electrode is connected to the first and second source-drain patterns through the first and second jumping contact holes.

14. The method of claim 9, further comprising, on the second substrate:
providing a black matrix; and
providing a color filter.

15. The method of claim 9, further comprising:
providing a first electrode on the thin film transistor, the first electrode being connected to the drain electrode; and
providing a light-emitting diode on the thin film transistor, the providing the light-emitting diode comprising:
providing an organic light-emitting layer on the first electrode; and
providing a second electrode on the organic light-emitting layer.

16. The method of claim 9, further comprising providing a stepped portion around the etched groove.

* * * * *